(12) United States Patent
Jeng

(10) Patent No.: US 6,403,470 B1
(45) Date of Patent: Jun. 11, 2002

(54) METHOD FOR FABRICATING A DUAL DAMASCENE STRUCTURE

(75) Inventor: Pei-Ren Jeng, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 09/791,023

(22) Filed: Feb. 22, 2001

(30) Foreign Application Priority Data

Jan. 3, 2001 (TW) ........................................ 90100097 A

(51) Int. Cl.$^7$ ............................................ H01L 21/768
(52) U.S. Cl. ...................... 438/637; 438/633; 438/637
(58) Field of Search ................................ 438/624, 633, 438/637, FOR 355, 692, FOR 111

(56) References Cited

U.S. PATENT DOCUMENTS 6,066,557 A * 5/2000 Lukanc et al. ............... 438/639

FOREIGN PATENT DOCUMENTS

JP 2001-298083 * 10/2001

OTHER PUBLICATIONS

"Controlling the Molecular Architecture of Fluorocarbon CVD Dielectric Thin Films" Karen K. Gleason/pp. 310–335. Department of Chemical Engineering. MIT (date unknown).

* cited by examiner

Primary Examiner—George Fourson
(74) Attorney, Agent, or Firm—J.C. Patents

(57) ABSTRACT

A fabrication method for a dual damascene structure includes forming a first dielectric layer on a substrate already comprises a first conductive layer formed therein. The first dielectric layer is then patterned to form a via opening, exposing the first conductive layer. After this, a second dielectric layer is formed on the first dielectric layer by hot filament chemical vapor deposition, wherein the second dielectric layer does not fill the via opening. The second dielectric layer is then patterned to form a trench. The trench and the via opening together form a dual damascene opening. A second conductive layer is further filled the damascene opening to complete the fabrication of a dual damascene structure.

24 Claims, 2 Drawing Sheets

METHOD FOR FABRICATING A DUAL DAMASCENE STRUCTURE

CROSS-REFERENCE TO RELATED APPLICATION

This application claims the priority benefit of Taiwan application serial no. 90100097, filed Jan. 3, 2001.

BACKGROUND OF THE INVENTION

1. Field of Invention

This invention relates to a fabrication method for multi-level interconnects. More particularly, the present invention relates to a fabrication method for a dual damascene structure.

2. Description of Related Art

The conventional fabrication method for the multilevel interconnects includes depositing a metal layer on an insulation layer, for example, a silicon oxide layer, which is used to isolate the metal layer. Subsequent to the formation of the metal layer, the metal layer is defined with the pre-defined conductive line pattern. An opening vertical to the conductive line layers is formed between the conductive line layers. A metal layer, which can be the same material or a different material from the conductive layer, is formed to fill the opening to complete the vertical connection of the conductive layer. As the number of the conductive line layers increases in integrated circuits, the metal layer design with two or more layers has gradually become a requirement for many integrated circuits. Inter-metal dielectrics (IMD) are often used to isolate metal layers. The conductive line that is used to connect the upper and the lower metal layers is known as a via in the semiconductor industry.

The dual damascene technique is a technique of concurrently forming the via the interconnects. The technique includes first forming an insulation layer on the substrate. After being planarized, the insulation layer is etched according the required metal conductive line pattern and the position of the via to form a via opening and a trench. Thereafter, a metal layer is deposited on the substrate, filling the via opening and the trench to concurrently form the metal conductive line and the via. Subsequently, chemical-mechanical polishing (CMP) is conducted to planarize the surface of the device to complete the fabrication of a dual damascene structure.

According to the conventional approach in forming the dual damascene structure, the etching technique and the etching stop layer are used to form sequentially the via opening and the trench. The profiles and the depths of the via opening and the trench are thus difficult to control. Moreover, since an etching stop layer is used, it is also difficult to effectively lower the dielectric constant of the inter-metal dielectrics.

SUMMARY OF THE INVENTION

The present invention provides a fabrication method for a dual damascene structure. This method uses hot filament chemical vapor deposition method to form a dielectric layer above the via opening without filling the via opening. Thus, in the subsequent formation of the trench, it only needs to form the opening in the dielectric layer. Moreover, not only the application of an etching stop layer is precluded, the dielectric constant of the inter-metal dielectrics is also effectively reduced. The difficulties of controlling the depths and the profiles of the via opening and the trench is resolved. The technique of hot filament chemical vapor deposition can refer to Karen K. Gleason, "Controlling the Molecular Architecture of Fluorocarbon CVD Dielectric Thin Films", Symposium of "Concepts and Needs for Low Dielectric Constant<0.15 micron Interconnect Materials: Now and Next Millennium" November, 1999, p. 310–336.

The present invention provides a fabrication method for a dual damascene structure. The method includes forming a first dielectric layer on a substrate, wherein a first conductive layer is already formed therein. The first dielectric layer is then patterned to form a via opening, exposing the first conductive layer. Thereafter, a second dielectric layer is formed on the first dielectric layer by hot filament chemical vapor deposition, wherein the second dielectric layer does not fill the via opening. The second dielectric layer is then patterned to form a trench, wherein the trench and the via opening together form a dual damascene opening. After this, a second conductive layer fills the dual damascene opening to complete the manufacturing of the dual damascene structure.

The present invention uses the hot filament chemical vapor deposition to form the second dielectric layer, which does not fill the via opening. The profile of the via opening is thus remained unchanged. Furthermore, in the subsequent formation of the trench, it only needs to form an opening in the second dielectric layer. The problems of controlling the profiles of the via opening and the trench after etching in forming the dual damascene structure are thus resolved.

The present invention employs the hot filament chemical vapor deposition to form the second dielectric layer without filling the via opening. Therefore, in the subsequent formation of the trench, it only needs to form the opening in the second dielectric layer. The application of an etching stop layer is thus precluded and the dielectric constant of the dielectric layer is thereby effectively reduced.

The present invention employs the hot filament chemical vapor deposition to form the second dielectric layer, which is porous. Furthermore, the porosity ratio can be adjusted accordingly. As a result, the dielectric constant of the dielectric layer can be effectively reduced to increase the isolation effect.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute as a part of this specification. The drawings illustrate embodiments of the invention and, together with the description, serve to explain the principles of the invention. In the drawings.

DESCRIPTION OF THE PREFERRED EMBODIMENTS

FIGS. 1A through 1F, are schematic, cross-sectional views, showing successive steps for the manufacturing of a dual damascene structure according to one preferred embodiment of this invention.

Figure 1A:
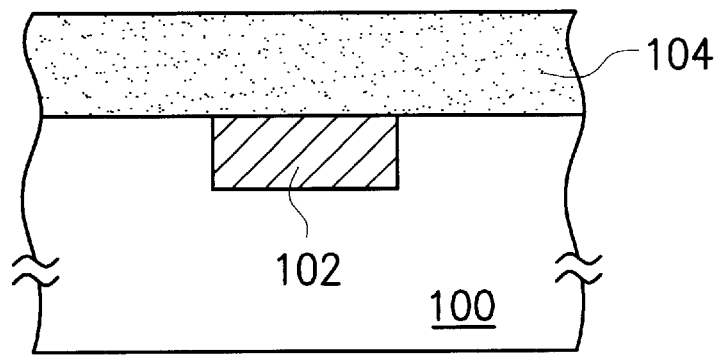
FIGS. 1A through 1F, are schematic, cross-sectional views, showing successive steps for the manufacturing of a dual damascene structure according to one preferred embodiment of this invention.

Referring to FIG. 1A, a semiconductor substrate 100 is provided, wherein a first conductive layer 102, such as a copper metal layer, is already formed therein. A first dielectric layer 104 is then formed on the substrate 100, covering the first conductive layer 102. The first conductive layer 104 includes materials such as fluoride containing glass.

Figure 1B:
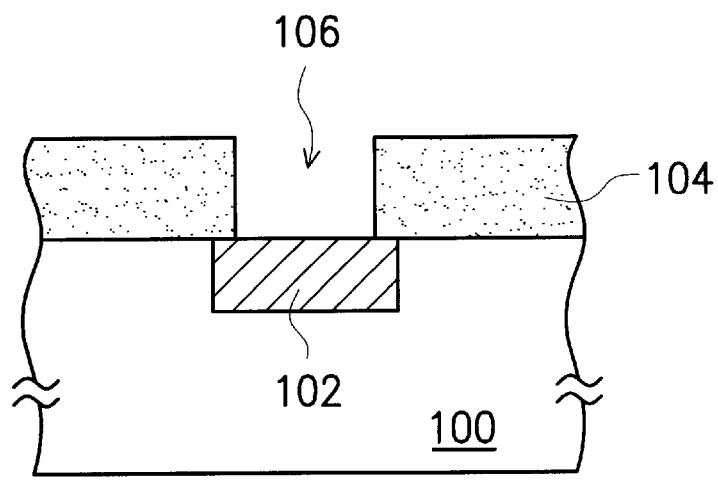

Continuing to FIG. 1B, the first dielectric layer 104 is patterned to form a via opening 106, exposing the first conductive layer 102. The via opening 106 is formed by, for example, photolithography and etching.

Figure 1C:
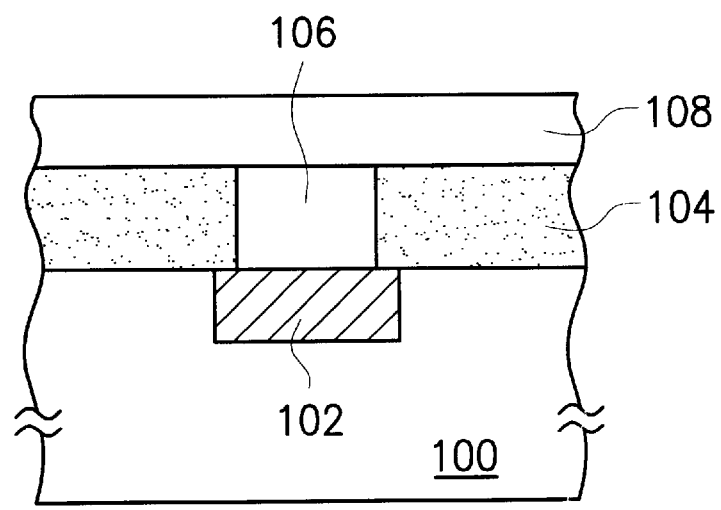

Referring to FIG. 1C, a second dielectric layer 108 is formed on the first dielectric layer 104 by hot filament chemical vapor deposition, wherein the second dielectric layer 108 does not fill the via opening 106. Forming the second dielectric layer 108 by hot filament chemical vapor deposition is conducted under, for example, 400 degrees Celsius to 800 degrees Celsius of hot filament temperature, 25 degrees Celsius of the substrate temperature, a pressure of 0.1 torr to 10 torr, and a HFPO($CF_3CFOCF_2$) flow rate of 10 sccm to 30 sccm. The second dielectric layer is, for example, carbon fluoride ($(CF_2)_n$).

Figure 1D:
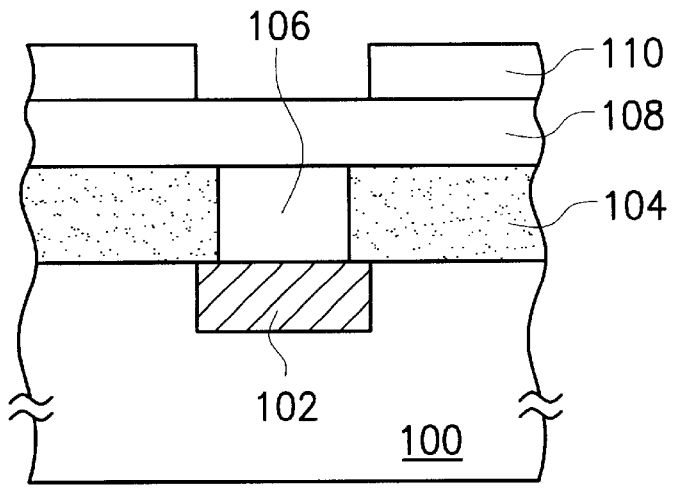
Figure 1E:
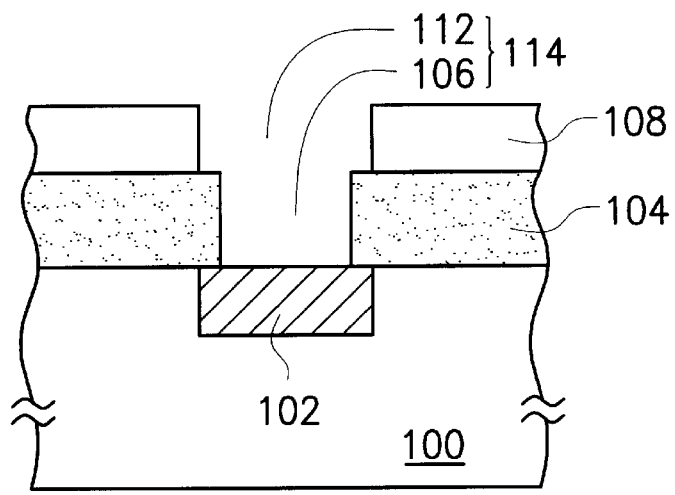

Continuing to FIGS. 1D and 1E, a patterned photoresist layer 110, which is used to define a trench, is formed on the second dielectric layer 108. Using the patterned photoresist layer 110 as a mask, the second dielectric layer 108 is removed to form a trench 112. The trench 112 and the via opening 106 together form the dual damascene opening 114, which exposes the first conductive layer 102.

Since the second dielectric layer 108 does not fill the via opening 106, the profile of the via opening 106 remains unchanged. Hence, in the subsequent formation of the trench 112, it only needs to form the opening in the second dielectric layer 108. The difficulties of controlling the profiles of the via opening 106 and the trench 112 after etching are thus resolved. Furthermore, the application of an etching stop layer is precluded to effectively lower the dielectric constant. The second dielectric layer 108 formed by the hot filament chemical vapor deposition is also porous. In addition, the porosity ratio can be adjusted accordingly. Thus, the dielectric constant can further be reduced to increase the isolation effect.

Figure 1F:
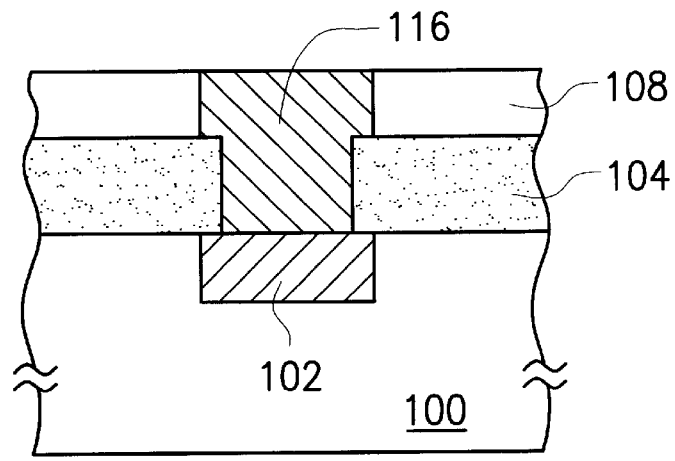

As shown in FIG. 1F, a second conductive layer fills the dual damascene opening 114 to form the dual damascene structure 116. The second conductive layer is, for example, copper metal. The dual damascene structure 116 is formed by, for example, forming the second conductive layer to cover the second dielectric layer 108 and to fill the dual damascene opening 114, followed by removing the excessive second conductive layer on the second dielectric layer 108, wherein removing the second conductive layer includes performing chemical-mechanical polishing.

According to the present invention, the second dielectric layer 108 is formed by hot filament chemical vapor deposition, in which the via opening 106 is prevented from being filled. The profile of the via opening 106 is thus remained unaffected. As a result, in the subsequent formation of the trench 112, it only needs to form the opening in the second dielectric layer 108. The difficulties of controlling the profiles of the via opening 106 and the trench 112 after etching are thereby resolved.

The second dielectric layer 108 of the present invention is formed by hot filament chemical vapor deposition, wherein the via opening 106 is not being filled. Thus, in the subsequent formation of the trench 112, it only needs to form the opening in the second dielectric layer 108. The application of an etching stop layer is thus precluded and the dielectric constant of the dielectric layer is effectively reduced.

The second dielectric layer 108 of the present invention, formed by hot filament chemical vapor deposition, is porous. Moreover, the porosity ratio can be adjusted accordingly. Hence, the dielectric constant of the dielectric layer can be effectively reduced to increase the isolation effect.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabrication method for a dual damascene structure, comprising:

providing a substrate, wherein a first conductive layer is already formed therein;

forming a first dielectric layer on the substrate;

patterning the first dielectric layer to forming a via opening, wherein the via opening exposes the first conductive layer;

forming a second dielectric layer by hot filament chemical vapor deposition on the first dielectric layer, wherein the second dielectric layer does not fill the via opening;

patterning the second dielectric layer to form a trench, wherein the trench and the via opening together form a dual damascene opening; and filling a second conductive layer in the dual damascene opening.

2. The method of claim 1, wherein the hot filament chemical vapor deposition to deposit the second dielectric layer is conducted under a hot filament temperature of about 400 degrees Celsius to 800 degrees Celsius.

3. The method of claim 1, wherein the hot filament chemical vapor deposition to deposit the second dielectric layer is conducted under a pressure of about 0.1 torr to 10 torr.

4. The method of claim 1, wherein the hot filament chemical vapor deposition to deposit the second dielectric layer is conducted under a substrate temperature of about 25 degrees Celsius to about 30 degrees Celsius.

5. The method of claim 1, wherein the hot filament chemical vapor deposition to deposit the second dielectric layer is conducted under a HFPO flow rate of about 10 sccm to 30 sccm.

6. The method of claim 1, wherein the second dielectric layer includes carbon fluoride ($(CF_2)_n$).

7. The method of claim 1, wherein the second dielectric layer formed by hot filament chemical vapor deposition comprises a porous quality.

8. The method of claim 1, wherein the first dielectric layer includes fluoride containing glass.

9. The method of claim 1, wherein the first conductive layer includes copper metal.

10. The method of claim 1, wherein the second conductive layer includes copper metal.

11. A method for fabricating a dual damascene structure, comprising:

providing a substrate, wherein a first conductive layer is already formed therein;

forming a first dielectric layer on the substrate;

patterning the dielectric layer to form a via opening, wherein the via opening exposes the conductive layer;

forming a carbon fluoride ($(CF_2)_n$) layer by hot filament chemical vapor deposition, wherein the ($(CF_2)_n$) does not fill the via opening;

patterning the ($(CF_2)_n$) layer to form a trench, wherein the trench and the via opening together form a dual damascene opening; and filling the dual damascene opening with a copper layer.

12. The method of claim 11, wherein the hot filament chemical vapor deposition to deposit the $((CF_2)_n)$ layer is conducted under a hot filament temperature of about 400 degrees Celsius to 800 degrees Celsius.

13. The method of claim 11, wherein the hot filament chemical vapor deposition to deposit the $((CF_2)_n)$ layer is conducted under a pressure of about 0.1 torr to 10 torr.

14. The method of claim 11, wherein the hot filament chemical vapor deposition to deposit the $((CF_2)_n)$ layer is conducted under a substrate temperature of about 25 degrees Celsius to 30 degrees Celsius.

15. The method of claim 11, wherein the hot filament chemical vapor deposition to deposit the $((CF_2)_n)$ layer is conducted under a flow rate of HFPO of about 10 sccm to 30 sccm.

16. The method of claim 11, wherein the $((CF_2)_n)$ layer formed by the hot filament chemical vapor deposition comprises a porous quality.

17. The method of claim 11, wherein the dielectric layer includes fluoride containing glass.

18. The method of claim 11, wherein conductive layer includes copper metal.

19. A fabrication method for a dual damascene structure, comprising:

provided a substrate, wherein a first conductive layer is already formed therein;

forming a first dielectric layer on the substrate;

patterning the first dielectric layer to form a via opening, wherein the via opening exposes the first conductive layer;

forming a second dielectric layer on the first dielectric layer, wherein the second dielectric layer does not fill the via opening;

patterning the second dielectric layer to form a trench, wherein the via opening and the trench together form a dual damascene opening; and filling the dual damascene opening with a second conductive layer.

20. The method of claim 19, wherein the second dielectric layer is formed by hot filament chemical vapor deposition.

21. The method of claim 19, wherein the second dielectric layer includes carbon fluoride $((CF_2)_n)$.

22. The method of claim 19, wherein the first dielectric layer includes fluoride containing glass.

23. The method of claim 19, wherein the first conductive layer includes copper metal.

24. The method of claim 19, wherein the second conductive layer includes copper metal.

* * * * *